(12) United States Patent
Park et al.

(10) Patent No.: US 9,343,161 B2
(45) Date of Patent: May 17, 2016

(54) SEMICONDUCTOR MEMORY DEVICE AND METHODS OF OPERATING THE SAME

(71) Applicant: SK hynix Inc., Incheon-si Gyeonggi-do (KR)

(72) Inventors: Seong Hun Park, Cheongju-si (KR); Jae Won Cha, Icheon-si (KR)

(73) Assignee: SK hynix Inc., Icheon-si, Gyeonggi-do ( * ) Notice: Subject to any disclaimer, the term of this patent is extended or adjusted under 35 U.S.C. 154(b) by 0 days.

(21) Appl. No.: 14/516,759

(22) Filed: Oct. 17, 2014

(65) Prior Publication Data

US 2015/0036433 A1 Feb. 5, 2015

Related U.S. Application Data

(62) Division of application No. 13/613,320, filed on Sep. 13, 2012, now Pat. No. 8,885,419.

(30) Foreign Application Priority Data

Aug. 8, 2012 (KR) .......................... 10-2012-0086902

(51) Int. Cl.
| | | |
|---|---|---|
| *G11C 11/34* | (2006.01) | |
| *G11C 16/16* | (2006.01) | |
| *G11C 16/02* | (2006.01) | |
| *G11C 11/56* | (2006.01) | |
| *G11C 16/04* | (2006.01) | |
| *G11C 16/14* | (2006.01) | |
| *G11C 16/26* | (2006.01) | |

(52) U.S. Cl.
CPC ............ *G11C 16/16* (2013.01); *G11C 11/5642* (2013.01); *G11C 16/02* (2013.01); *G11C 16/0483* (2013.01); *G11C 16/14* (2013.01); *G11C 16/26* (2013.01)

(58) Field of Classification Search
USPC ..................................................... 365/185.29
See application file for complete search history.

(56) References Cited

U.S. PATENT DOCUMENTS

| | | | | |
|---|---|---|---|---|
| 2005/0169057 A1* | 8/2005 | Shibata | .............. | G11C 11/5628 365/185.28 |
| 2006/0171210 A1* | 8/2006 | Nagashima | ........ | G11C 11/5628 365/189.16 |
| 2008/0158994 A1* | 7/2008 | Yang | ................... | G11C 11/5635 365/185.22 |
| 2011/0176362 A1* | 7/2011 | Shibata | .............. | G11C 11/5635 365/185.03 |
| 2011/0238889 A1* | 9/2011 | Miakashi | ........... | G11C 11/5628 711/103 |

* cited by examiner

*Primary Examiner* — Anthan Tran
(74) *Attorney, Agent, or Firm* — William Park & Associates Ltd.

(57) ABSTRACT

A semiconductor memory device comprises a memory cell array including a plurality of memory blocks each including a plurality of pages, wherein each of the plurality of pages includes at least one flag cell indicating whether data is in a corresponding page, and a peripheral circuit configured to read data of flag cells of a selected memory block in response to an erase request and to omit an erase operation on the selected memory block based on the data of the flag cells.

7 Claims, 7 Drawing Sheets

|  | Supply voltage |
|---|---|
| DSL | Vsel |
| WL1~WLn | Vwl |
| SSL | Vsel |
| CSL | Vss |

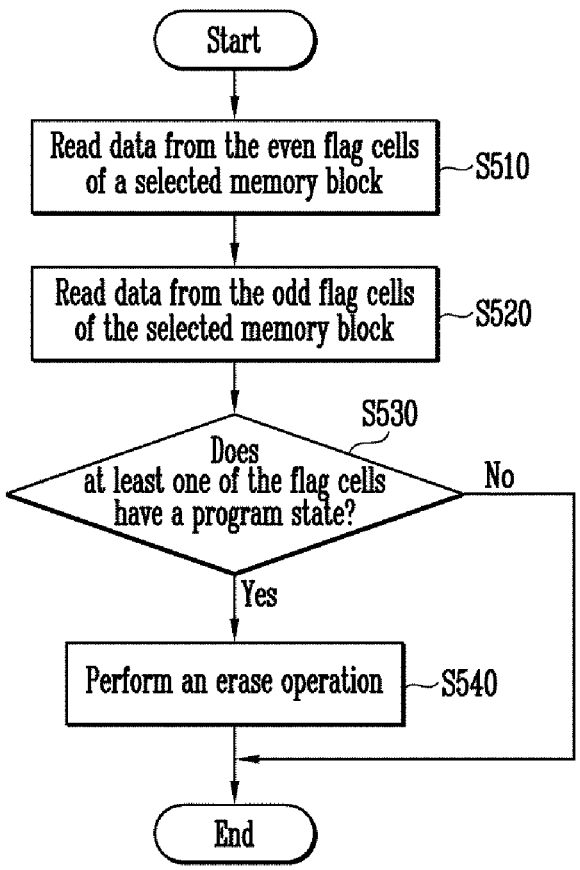

SEMICONDUCTOR MEMORY DEVICE AND METHODS OF OPERATING THE SAME

CROSS-REFERENCE TO RELATED APPLICATION

Priority to Korean patent application number 10-2012-0086902 filed on Aug. 8, 2012, the entire disclosure of which is incorporated by reference herein, is claimed.

BACKGROUND

Various embodiments of the present invention relate generally to a semiconductor memory device and methods of operating the same.

Semiconductor memory is a memory device comprising of semiconductor materials, such as silicon (Si), germanium (Ge), gallium arsenide (GaAs), and indium phosphide (InP), and chiefly divided into volatile and nonvolatile types.

Volatile memory is a memory device in which data stored therein is lost when the supply of power is blocked. Different types of volatile memory include static RAM (SRAM), dynamic RAM (DRAM), and synchronous DRAM (SDRAM). Nonvolatile memory is a memory device that retains data stored therein even when the supply of power is blocked. Different types of nonvolatile memory includes ROM (Read Only Memory), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and ferroelectric RAM (FRAM). Flash memory is chiefly divided into NOR and NAND types.

The memory cell of a semiconductor memory device, such as flash memory, is supplied with high voltage when a program operation and an erase operation are performed. The memory cell of the semiconductor memory device gradually deteriorates as the program/erase cycle increases, at which the threshold voltage of the memory cell rises even though data stored remains unchanged. This lowers the reliability of the semiconductor memory device.

BRIEF SUMMARY

Various embodiments of this disclosure are directed to reducing the deterioration of a semiconductor memory device.

A semiconductor memory device in accordance with an embodiment of the present invention comprises a memory cell array including a plurality of memory blocks each including a plurality of pages, wherein each of the plurality of pages includes at least one flag cell indicating whether data is stored in a corresponding page, and a peripheral circuit configured to read data from the flag cells of a selected memory block in response to an erase request and to omit an erase operation on the selected memory block based on the data of the flag cells.

The peripheral circuit may be configured to omit the erase operation when the flag cells of the selected memory block are in an erase state.

The peripheral circuit may be configured to perform the erase operation when at least one of the flag cells of the selected memory block is in a program state.

The peripheral circuit may be configured to program the at least one flag cell when a program operation before the erase request is received is performed on each of the plurality of pages.

The plurality of pages may include a plurality of even and odd pages, and may further include first flag cells indicating whether data is stored in the plurality of even pages and second flag cells indicating whether data is stored in the plurality of odd pages.

The peripheral circuit may be configured to read data from the first flag cells of the selected memory block and data from the second flag cells of the selected memory block and to omit the erase operation based on the read data.

In another embodiment, a method of erasing a semiconductor memory device includes reading data from flag cells corresponding to a plurality of pages of a selected memory block in response to an erase request, and omitting an erase operation on the selected memory block based on the read data. Each of the flag cells indicates whether data is stored in the plurality of pages.

A semiconductor memory device in accordance with another embodiment of the present invention comprises a memory cell array including a plurality of memory blocks each including a plurality of pages, wherein each of the plurality of pages includes at least one flag cell indicating whether data is stored in a corresponding page, and a peripheral circuit configured to read data from the flag cells of a selected memory block in response to an erase request, and to perform a soft erase operation on the selected memory block using a first erase pulse that is lower than a second erase pulse of a normal erase operation based on the read data.

The peripheral circuit may be configured to perform the soft erase operation when the flag cells of the selected memory block are in an erase state.

The peripheral circuit may be configured to perform the normal erase operation on the selected memory block when at least one of the flag cells of the selected memory block is in a program state.

BRIEF DESCRIPTION OF THE DRAWINGS

FIG. 11 is a flowchart illustrating an erase method in accordance with another embodiment of the present invention; and FIG. 12 is a table illustrating step S530 of FIG. 11 in more detail.

DESCRIPTION OF EMBODIMENTS

Hereinafter, various embodiments of the present invention will be described in detail with reference to the accompanying drawings. The figures are provided to allow those having ordinary skill in the art to understand the scope of the embodiments of the present invention.

Throughout this specification, an element that is "coupled (or connected)" to the other element may refer to one element "directly coupled (or connected)" to the other element or "electrically coupled (or connected)" to the other element through a third element. Furthermore, when one part "includes (or comprises)" the other part, the one part may further include other elements unless otherwise specified.

Figure 1:
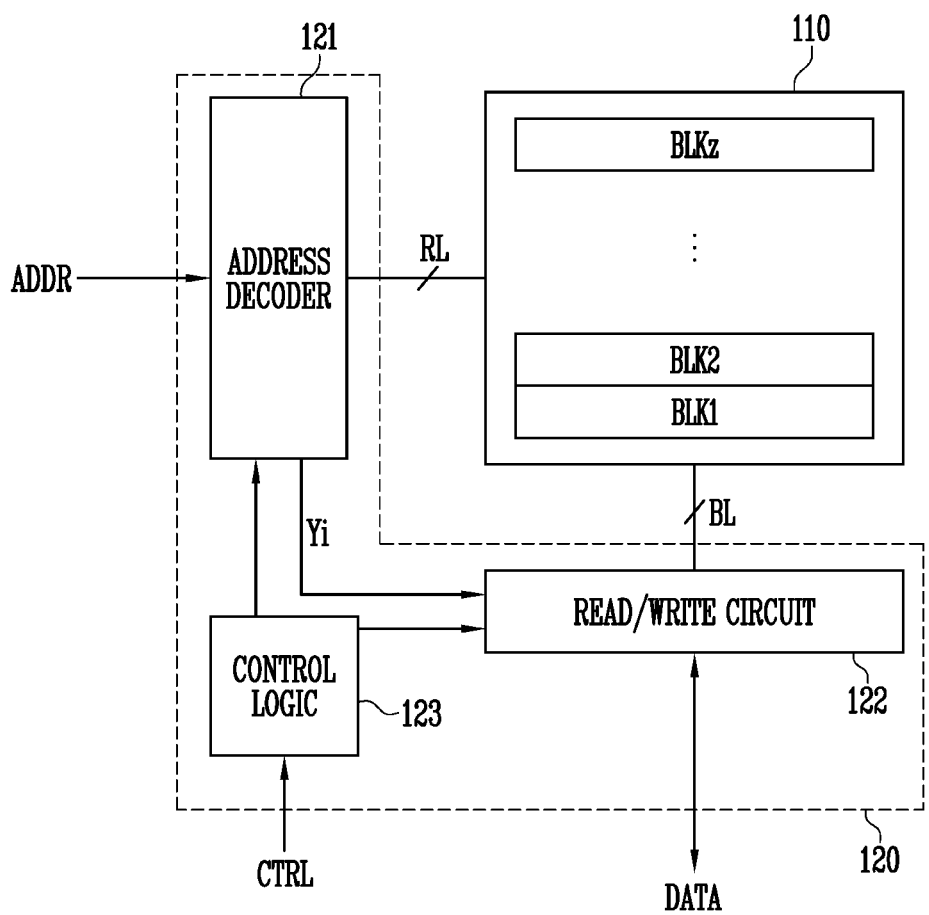
FIG. 1 is a block diagram showing a semiconductor memory device in accordance with an embodiment of the present invention.
Figure 2:
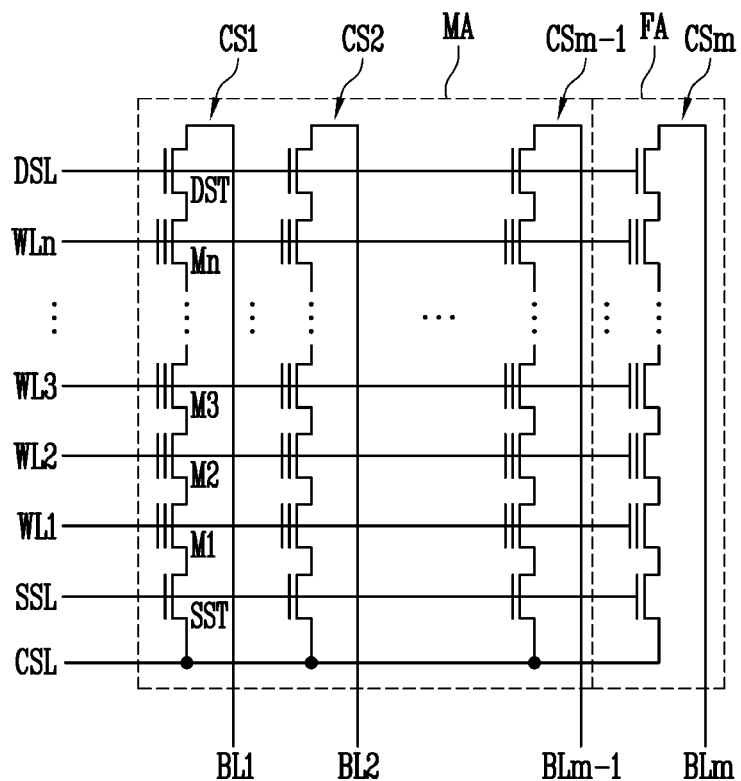
FIG. 2 is a circuit diagram showing one of a plurality of memory blocks shown in FIG. 1.
Figure 3:
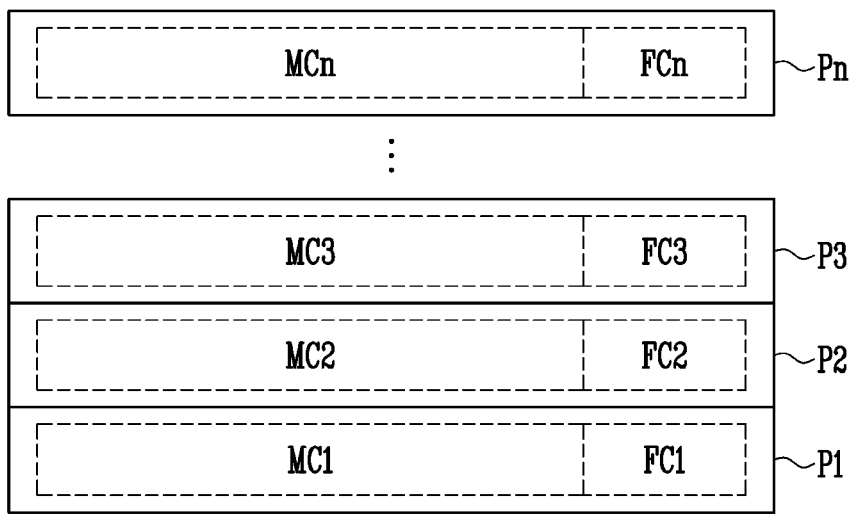
FIG. 3 is a block diagram conceptually showing a first memory block.

FIG. 1 is a block diagram showing a semiconductor memory device 100 in accordance with an embodiment of this disclosure, FIG. 2 is a circuit diagram showing one (for example, BLK1) of a plurality of memory blocks BLK1~BLKz shown in FIG. 1, and FIG. 3 is a block diagram conceptually showing a first memory block BLK1.

Referring first to FIG. 1, the semiconductor memory device 100 includes a memory cell array 110 and a peripheral circuit 120 configured to drive the memory cell array 110.

The memory cell array 110 is coupled to an address decoder 121 through row lines RL, which include a drain select line, word lines, and a source select line, and is coupled to a read/write circuit 122 through bit lines BL. Each of a plurality of memory blocks BLK1~BLKz includes a plurality of memory cells. Memory cells disposed in a row direction are coupled to the word lines, and memory cells disposed in a column direction are coupled to the bit lines BL.

Referring to FIG. 2, the first memory block BLK1 is coupled to the read/write circuit 122 through first to $m^{th}$ bit lines BL1~BLm, and is also. coupled to the address decoder 121 through the common source line CSL and row lines RL (refer to FIG. 1)

The first memory block BLK1 includes first to $m^{th}$ cell strings CS1~CSm, which are coupled to the first to $m^{th}$ bit lines BL1~BLm, respectively. Each of the cell strings includes a source select transistor SST coupled to the source select line SSL, first to $n^{th}$ memory cells M1~Mn coupled to the first to $n^{th}$ word lines WL1~WLn, respectively, and a drain select transistor DST coupled to the drain select line DSL. The source terminals of the source select transistors SST of the cell strings are coupled to the common source line CSL, and the drain terminals of the drain select transistors DST of the cell strings are coupled to the first to $m^{th}$ bit lines BL1~BLm.

In accordance with an embodiment of the present invention, the first memory block BLK1 is divided into a main region MA and a flag region FA, where the main region MA comprises of the first to $(m-1)^{th}$ cell strings CS1~CSm-1, and the flag region FA comprises of a $m^{th}$ cell string CSm. In FIG. 2, the flag region FA is illustrated as including one cell string CSm, but this is only illustrative as it may include a plurality of cell strings.

Data, such as an externally received data DATA (refer to FIG. 1) is stored in the memory cells of the main region MA (hereinafter referred to as main memory cells). Data indicating whether data DATA has been stored in the main memory cells is stored in the memory cells of the flag region FA (hereinafter referred to as flag memory cells).

Each of the second to $z^{th}$ memory blocks BLK2~BLKz may be configured like the first memory block BLK1 described with reference to FIG. 2.

Referring to FIG. 3, memory cells coupled to one word line form one physical page. Memory cells coupled to the first word line WL1, second word line WL2, third word line WL3, and nth word line WLn form a first physical page P1, a second physical page P2, a third physical page P3, and an nth physical page Pn, respectively.

Each of the physical pages includes main memory cells coupled to one word line and one or more flag cells indicating whether data has been stored in the main memory cells. The first physical page P1, second physical page P2, third physical page P3, and nth physical page Pn includes first main memory cells MC1 and a first flag cell FC1, second main memory cells MC2 and a second flag cell FC2, third main memory cells MC3 and a third flag cell FC3, and nth main memory cells MCn and an nth flag cell FCn.

Referring back to FIG. 1, the peripheral circuit 120 includes the address decoder 121, the read/write circuit 122, and control logic 123.

The address decoder 121 is coupled to the memory cell array 110 through the row lines RL. The address decoder 121 is configured to operate under the control of the control logic 123 and receives addresses ADDR from the outside or from an I/O buffer (not shown) of the semiconductor memory device 100.

The address decoder 121 is configured to decode a block address from among the received addresses ADDR, thereby selecting one memory block in response to the decoded block address.

The address decoder 121 may decode a row address from among the received addresses ADDR, thereby selecting one of the word lines in response to the decoded row address.

The address decoder 121 may decode a column address from among the received addresses ADDR and send the decoded column address Yi to the read/write circuit 122.

In read and program operations, the addresses ADDR may include the block address, the row address, and the column address. The address decoder 121 may select one memory block and one word line in response to the addresses ADDR and provide the decoded column address Yi to the read/write circuit 122.

In an erase operation, the addresses ADDR may include the block address. The address decoder 121 may select one memory block in response to the addresses ADDR.

The address decoder 121 may include a block decoder, a row decoder, a column decoder, and an address buffer.

The read/write circuit 122 is coupled to the memory cell array 110 through the bit lines BL, and is configured to operate under the control of the control logic 123.

In a program operation and a read operation, the read/write circuit 122 exchanges the data DATA with the outside or the I/O buffer (not shown) of the semiconductor memory device 100. Particularly, in a program operation, the read/write circuit 122 receives the data DATA and transfers the received data DATA to bit lines indicated by a decoded column address Yi, from among the bit lines BL. The transferred data DATA is programmed into memory cells coupled to a selected word line. In a read operation, the read/write circuit 122 reads data from memory cells that are coupled to a selected word line through bit lines indicated by a decoded column address Yi, from among the bit lines BL, and outputs the read data DATA. In an erase operation, the bit lines BL may be floating.

The read/write circuit 130 may include page buffers or page registers and a column selector.

The control logic 123 is coupled to the address decoder 121 and the read/write circuit 122, receives a control signal CTRL from the outside or the I/O buffer (not shown) of the semiconductor memory device 100, and is configured to control an overall operation of the semiconductor memory device 100 in response to the control signal CTRL.

In accordance with the present embodiment, the control logic 123 controls the address decoder 121 and the read/write circuit 122 so that data is read from the flag cells of a selected memory block in response to the control signal CTRL that requests an erase operation. The control logic 123 may receive the read data through the read/write circuit 122. The control logic 123 may be configured to omit an erase operation on the selected memory block according to the read data or when all the data of the flag cells of a selected memory block is in the erase state. If the execution of the erase operation is selectively omitted as described above, memory cell array 110 may deteriorated less. Thus, when an erase operation is selectively omitted, the operating speed of the semiconductor memory device 100 and the operating speed of a controller outside the semiconductor memory device 100 may improve.

Although not shown in FIG. 1, the semiconductor memory device 100 may further include the I/O buffer (not shown), which may receive the control signal CTRL and the addresses ADDR from the outside and transfer the addresses ADDR and the control signal CTRL to the address decoder 121 and the control logic 123, respectively. It may be configured to transfer external data DATA to the read/write circuit 122 and transfer the data DATA of the read/write circuit 122 to the outside.

In the above embodiments, the semiconductor memory device 100 may be a flash memory device.

Figure 4:
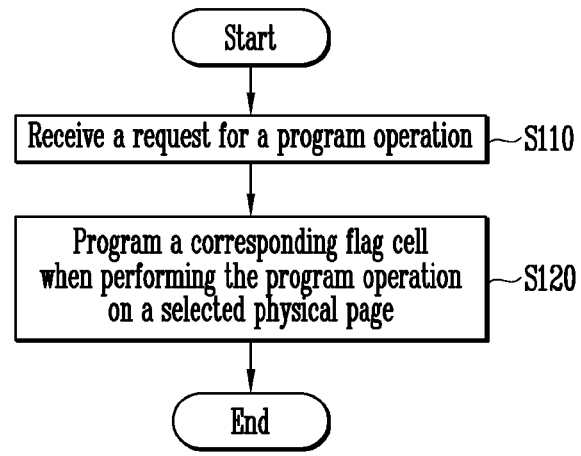
FIG. 4 is a flowchart illustrating a method of programming the semiconductor memory device in accordance with an embodiment of this disclosure.

FIG. 4 is a flowchart illustrating a method of programming the semiconductor memory device 100 in accordance with an embodiment of the present invention.

Referring to FIGS. 1 and 4, a request for a program operation is received at step S110. A control signal CTRL indicating the program operation, an address ADDR, and data DATA to be programmed may be inputted to the peripheral circuit 120.

At step S120, when the program operation is performed on a selected physical page, a flag cell included in the selected physical page is also programmed. In response to the request, the peripheral circuit 120 may program the data DATA into main memory cells of a physical page corresponding to the address ADDR. The peripheral circuit 120 programs the data DATA into the flag cell of the physical page corresponding to the address ADDR.

Accordingly, when each physical page is programmed, the flag cell included in the physical page has a program state.

Figure 5:
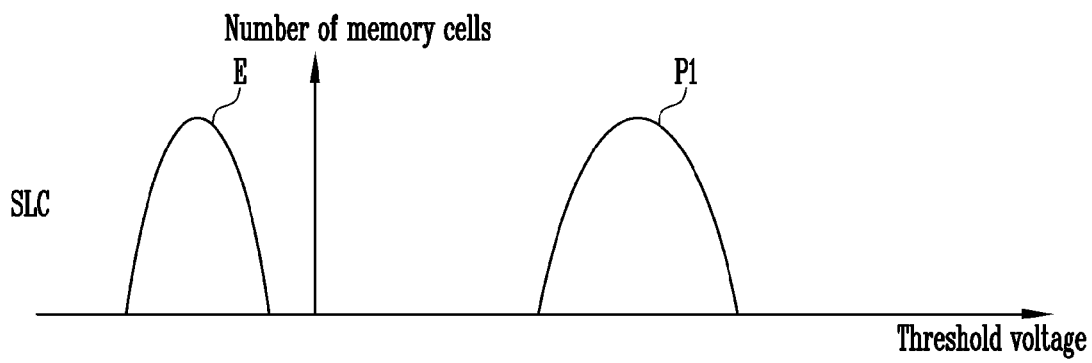
FIG. 5 is a diagram showing distributions of the threshold voltages of the memory cells within the memory cell array shown in FIG. 1.
Figure 5:
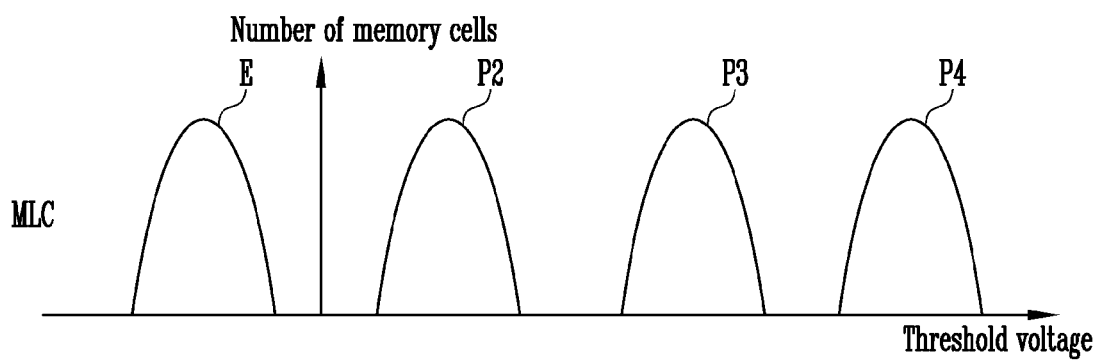

FIG. 5 is a diagram showing distributions of the threshold voltages of the memory cells within the memory cell array 110 shown in FIG. 1.

Referring to FIG. 5, if each of the memory cells are defined as a single level cell (SLC), the memory cells may have an erase state E and a first program state P1. When a selected physical page is programmed, each of the memory cells included in the selected physical page may be programmed to have the erase state E or the first program state P1 in response to data DATA to be programmed (refer to FIG. 1). The flag cell of the selected physical page is programmed to have the first program state P1, and if a plurality of flag cells is included in the selected physical page, all the flag cells may be programmed to have the first program state P1.

If each of the memory cells are defined as a multi-level cell (MLC), the memory cells may have an erase state E and second to fourth program states P2~P4. When a selected physical page is programmed, each of the memory cells included in the selected physical page may be programmed to have one of the erase state E and the second to fourth program states P2~P4 in response to data DATA to be programmed. The flag cell of the selected physical page may also be programmed to have a threshold voltage that corresponds to one of the second to fourth program states P2~P4 for example.

It is hereinafter assumed that each of the memory cells of the memory cell array 110 is an SLC, for convenience of description, but it is to be noted that the present invention is not limited thereto.

Figures 6, 7:
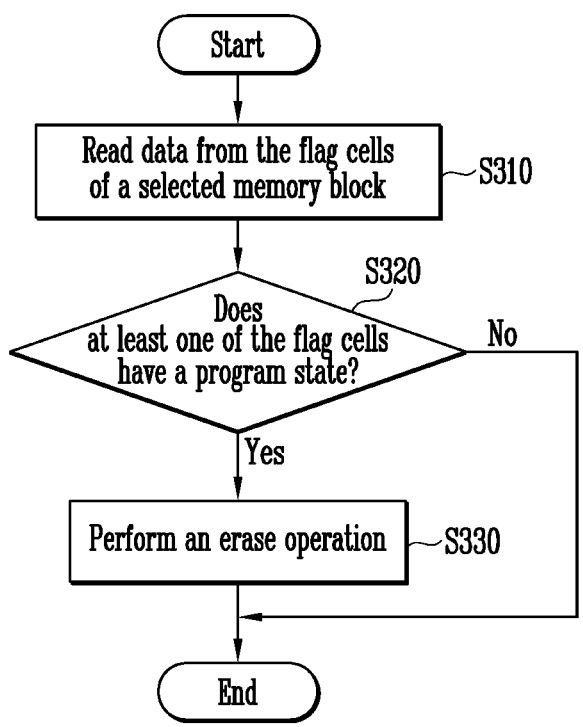
FIG. 6 is a flowchart illustrating an erase method in accordance with an embodiment of the present invention.
FIG. 7 is a table showing voltages supplied to a selected memory block when reading data from the flag cells of the selected memory block.

FIG. 6 is a flowchart illustrating an erase method in accordance with an embodiment of the present invention, and FIG. 7 is a table showing voltages supplied to a selected memory block when reading data from the flag cells of the selected memory block.

Referring first to FIGS. 1 and 6, at step S310, the peripheral circuit 120 reads data from the flag cells of a selected memory block in response to the control signal CTRL indicating an erase operation.

When reading the data, the bit line BLm may be precharged and voltages of the row lines RL coupled to the selected memory block may be biased. Referring to FIGS. 2 and 7, the common source line CSL may be supplied with a reference voltage Vss such as 0 V, the source select line SSL and the drain select line DSL of the selected memory block may be supplied with a selection voltage Vsel such as 4.5 V, and the first to $n^{th}$ word lines WL1~WLn may be supplied with a word line voltage Vwl. The word line voltage Vwl may be voltage between the erase state E (refer to FIG. 5) and the program state P1 such as 0 V.

In accordance with the bias conditions, when all the flag cells are in the erase state E, electric charges precharged in the bit line BLm may be discharged to the common source line CSL through the cell string CSm. When at least one of the flag cells is in the program state P1, the electric charges of the bit line BLm may not be discharged. The read/write circuit 122 senses the voltage of the bit line BLm and stores data corresponding to the sensed voltage in an internal latch, which in turn may be transferred to the control logic 123. The control logic 123 determines whether all the flag cells are in the erase state E or if at least one of the flag cells is in the program state P1 or not based on the receive data.

A method of reading the data from the flag cells may be altered in various ways. The data may be sequentially read from the flag cells coupled to the first to $n^{th}$ word lines WL1~WLn.

Referring back to FIGS. 1 and 6, at step S320, either the erase operation is performed at step S330 or the erase operation is omitted entirely depending on whether one or more of the flag cells are in the program state.

The erase operation is performed by supplying an erase pulse to a bulk region corresponding to the selected memory block and repeatedly performing a verify operation to determine whether the memory cells of the selected memory block have respective threshold voltages each lower than a specific voltage. If the verify process passes, a soft program operation may be further performed.

Since the erase operation is performed on each memory block, data stored in both the main memory cells and flag memory cells of the selected memory block, is erased.

Figure 8:
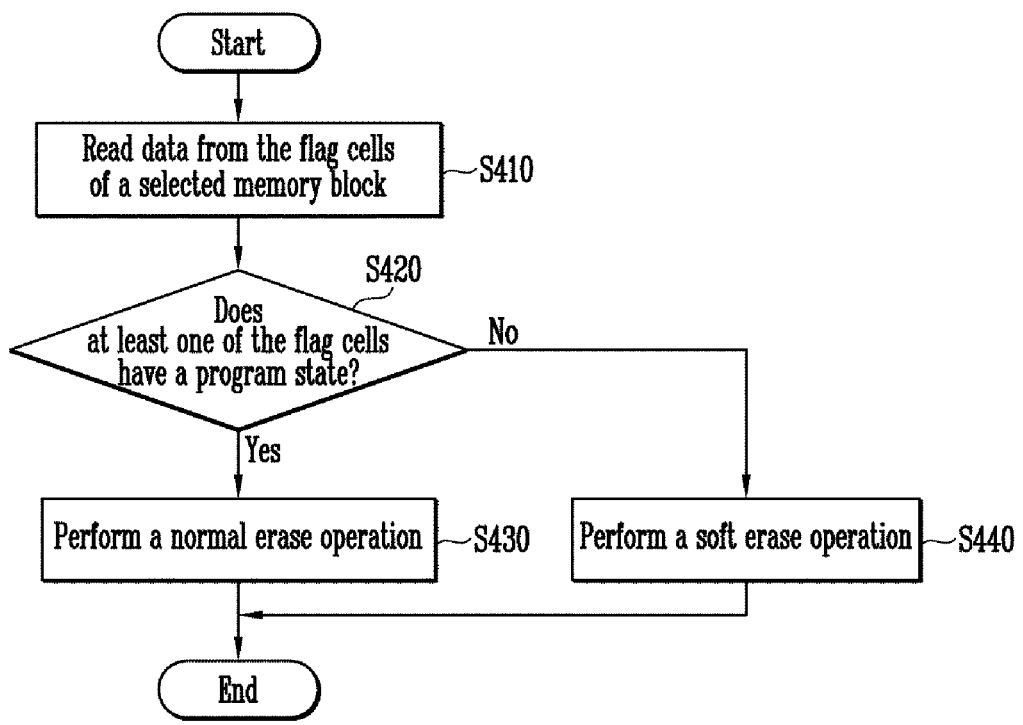
FIG. 8 is a flowchart illustrating an erase method in accordance with another embodiment of the present invention.

FIG. 8 is a flowchart illustrating an erase method in accordance with another embodiment of the present invention.

Referring to FIG. 8, at step S410, a read operation is performed on the flag cells of a selected memory block. Whether at least one of the flag cells is in a program state is determined at step S420. If it is determined that at least one of the flag cells has a program state, step S430 is performed. Otherwise, step S440 is performed.

Step S430 comprises of a normal erase operation, and step S440 comprises of a soft erase operation. Like the erase operation described with reference to FIG. 6, the normal erase operation is performed by supplying an erase pulse to a bulk region corresponding to the selected memory block, performing a verify operation to determine whether the memory cells of the selected memory block have respective threshold voltages each lower than a specific voltage, and repeating the verify operation by supplying an increased erase pulse according to a result of the verification. The soft erase operation is performed like the normal erase operation except that an erase pulse lower than the erase pulse used in the normal erase operation is used.

The start voltage of the erase pulse that is used in the soft erase operation may be lower than the start voltage of the erase pulse that is used in the normal erase operation. Furthermore, an increment of the erase pulse used in the soft erase operation may be smaller than an increment of the erase pulse used in the normal erase operation.

Supplying a low erase pulse to the bulk region of the selected memory block translates to less deterioration of the selected memory block, thereby causing less deterioration of the memory cell array 110.

Figure 9:
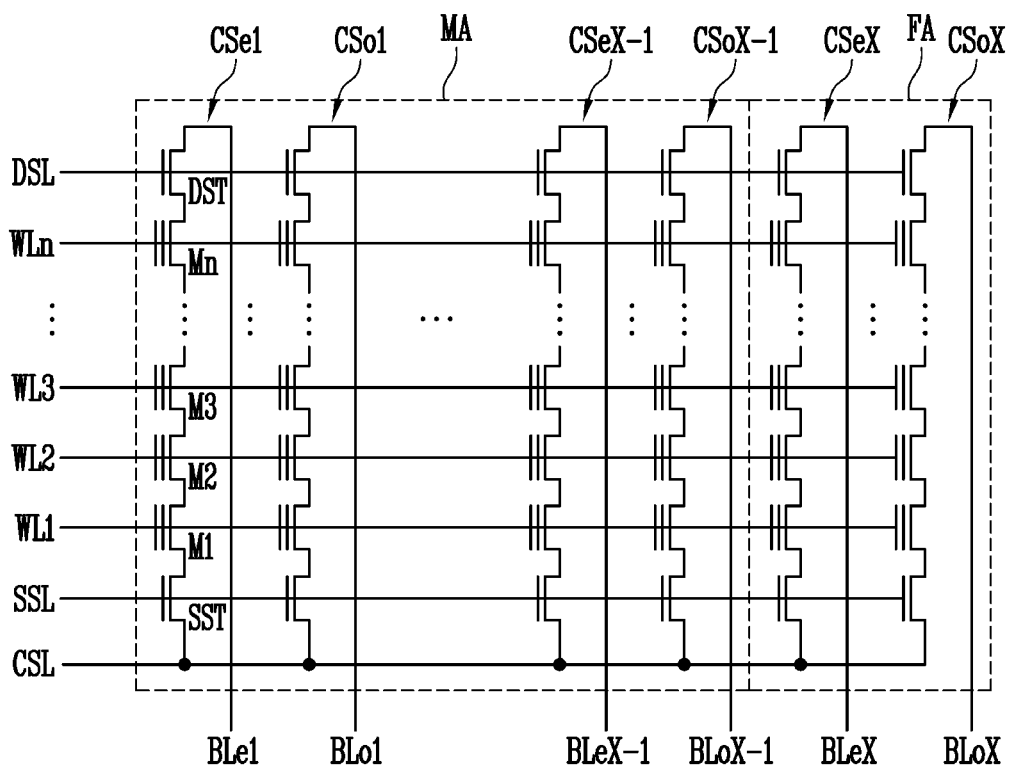
FIG. 9 is a circuit diagram showing another embodiment of the memory block of FIG. 1.

FIG. 9 is a circuit diagram showing another embodiment of the memory block of FIG. 1.

Referring to FIG. 9, a first memory block BLK1' includes first to $X^{th}$ even cell strings CSe1~CSeX and first to $X^{th}$ odd cell strings CSo1~CSoX. The first to $X^{th}$ even cell strings CSe1~CSeX are coupled to first to $X^{th}$ even bit lines BLe1~BLeX, respectively, and the first to $X^{th}$ odd cell strings CSo1~CSoX are coupled to first to $X^{th}$ odd bit lines BLo1~BLoX, respectively.

A $Y^{th}$ (Y is a natural number equal to or smaller than X) even bit line BLeY and a $Y^{th}$ odd bit line BLoY form a pair of bit lines. Although not shown in FIG. 9, the pair of bit lines is coupled to one page buffer.

The first memory block BLK1' is divided into a main region MA and a flag region FA. In accordance with the present invention, the flag region FA includes the $X^{th}$ even cell string CSeX, indicating whether data has been stored in the even cell strings CSe1~CSeX-1 of the main region MA, and the $X^{th}$ odd cell string CSoX, indicating whether data has been stored in the odd cell strings CSo1~CSoX-1 of the main region MA.

Each of the first to $z^{th}$ memory blocks BLK1~BLKz of FIG. 1 may be configured like the first memory block BLK1' described with reference to FIG. 8.

Figure 10:
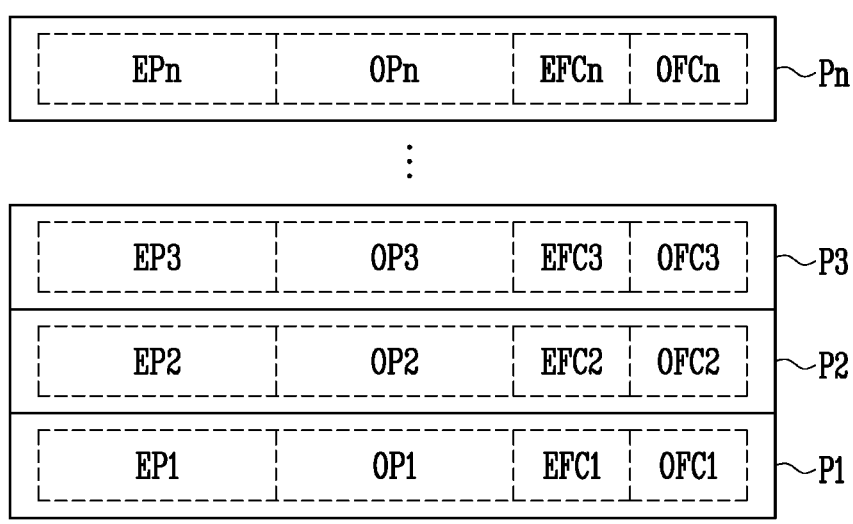
FIG. 10 is a block diagram conceptually showing the memory block of FIG. 9.

FIG. 10 is a block diagram conceptually showing the first memory block BLK1' of FIG. 9.

Referring to FIG. 10, one physical page includes an even page, an odd page, an even flag cell, and an odd flag cell which correspond to one word line. The even page (for example, EP1) includes main memory cells coupled to one word line (for example, WL1) in the even cell strings CSe1~CSeX-1 of the main region MA, and the odd page (for example, EP1) includes main memory cells coupled to one word line (for example, WL1) in the odd cell strings CSo1~CSoX-1 of the main region MA. The even flag cell (for example, EFC1) corresponds to the $X^{th}$ even cell string CSeX of the flag region FA, and the odd flag cell (for example, OFC1) corresponds to the $X^{th}$ odd cell string CSoX of the flag region FA.

When the even page (for example, EP1) is programmed, the even flag cell (for example, EFC1) of a corresponding physical page is programmed, and when the odd page (for example, OP1) is programmed, the odd flag cell (for example, OFC1) of a corresponding physical page is programmed.

Accordingly, when an even flag cell has the erase state, it means that data is not stored in a corresponding even page, and likewise, when an odd flag cell has the erase state, it means that data is not stored in a corresponding odd page.

FIG. 11 is a flowchart illustrating an erase method in accordance with another embodiment of the present invention.

Referring to FIGS. 1 and 11, at step S510, data is read from the even flag cells of a selected memory block. A method of reading the data of the even flag cells may be performed like the method described with reference to FIG. 7.

At step S520, data is read from the odd flag cells of the selected memory block. A method of reading the data of the odd flag cells may be performed like the method described with reference to FIG. 7.

FIG. 11 illustrates that the read operation is first performed on the even flag cells and the read operation is then performed on the odd flag cells, but the order of the read operations may be changed.

At step S530, whether at least one of the even flag cells and the odd flag cells has a program state is determined. If it is determined that at least one of the even flag cells and the odd flag cells has a program state, an erase operation is performed at step S540. Otherwise, it is determined that at least one of the even flag cells and the odd flag cells does not have a program state, in which case an erase operation may be omitted.

FIG. 12 is a table illustrating criteria for the determination at step S530 of FIG. 11.

Referring to FIG. 12, if the even flag cells and the odd flag cells are in a program state, or if the even flag cells are in the erase state and the odd flag cells are in a program state, or if the even flag cells are in a program state and the odd flag cells are in the erase state, the erase operation may be performed. If the even flag cells and the odd flag cells are in the erase state, an erase operation may be omitted.

Consequently, if it is determined that data has not been stored in both the even cell strings CSe1~CSeX-1 and the odd cell strings CSo1~CSoX-1 (refer to FIG. 9) of the main region MA based on data stored in the even flag cells and data stored in the odd flag cells, an erase operation may be omitted.

In accordance with the present invention, an erase operation is omitted according to the flag cells of a selected memory block, or an erase operation using a low erase pulse is performed. Accordingly, the memory cell array 110 is deteriorated less.

What is claimed is:

1. A semiconductor memory device, comprising:
   a memory cell array including a plurality of memory blocks each comprising a plurality of pages, wherein each of the plurality of pages comprises a plurality of main data cells and at least one flag cell indicating whether data is stored in the plurality of main data cells in a corresponding page; and
   a peripheral circuit configured to read data from the flag cells of a selected memory block in response to an erase request and to perform a soft erase operation on the selected memory block using a first erase pulse lower than a second erase pulse of a normal erase operation based on the read data,
   wherein when a program operation is performed on at least one main memory cell in each of the plurality of pages before the erase request is received, a corresponding flag cell is programmed to have a program state.

2. The semiconductor memory device of claim 1, wherein the peripheral circuit is configured to perform the soft erase operation when the flag cells of the selected memory block are in an erase state.

3. The semiconductor memory device of claim 1, wherein the peripheral circuit is configured to perform the normal erase operation on the selected memory block when at least one of the flag cells of the selected memory block is in a program state.

4. The semiconductor memory device of claim 1, wherein the peripheral circuit is configured to read the data from the flag cells by precharging a bit line coupled to the flag cells and sensing a voltage of the bit line to determine whether at least one of the flag cells is in a program state or the flag cells are in an erase state when a word line voltage is supplied to word lines coupled to the flag cells.

5. A semiconductor memory device, comprising:
- a memory cell array including a plurality of memory blocks each comprising a plurality of pages, wherein each of the plurality of pages comprises a plurality of main data cells and at least one flag cell indicating whether data is stored in the plurality of main data cells in a corresponding page; and
- a peripheral circuit configured to program a corresponding flag cell to have a program state when a program operation is performed on at least one main memory cell in each of the plurality of pages,
- wherein the peripheral circuit configured to perform a read operation on the flag cells of a selected memory block to determine whether at least one of the flag cells is in the program state or the flag cells are in an erase state, in response to an erase request from the external, and
- wherein the peripheral circuit configured to perform a soft erase operation on the selected memory block using a first erase pulse when the flag cells are in the erase state, and to perform a normal erase operation on the selected memory block using a second erase pulse higher than the first erase pulse when at least one of the flag cells is in the program state.

6. The semiconductor memory device of claim 5, wherein the peripheral circuit is configured to, in the read operation, precharge a bit line coupled to the flag cells and sensing a voltage of the bit line to determine whether at least one of the flag cells is in the program state or the flag cells are in the erase state when a word line voltage is supplied to word lines coupled to the flag cells.

7. A method of erasing for a semiconductor memory device, the method comprising:
- programming a flag cell included in a page of a selected memory block to have a program state when a program operation is performed on at least one memory cell in the page before an erase request is received;
- reading data from flag cells in pages of the selected memory block to determine whether at least one of the flag cells is in the program state or the flag cells are in an erase state, when the erase request is received; and
- performing a soft erase operation on the selected memory block using a first erase pulse when the flag cells are in the erase state, and
- performing a normal erase operation on the selected memory block using a second erase pulse higher than the first erase pulse when at least one of the flag cells is in the program state.

* * * * *